US010361192B2

(12) United States Patent
Rupp et al.

(10) Patent No.: US 10,361,192 B2
(45) Date of Patent: Jul. 23, 2019

(54) SEMICONDUCTOR DEVICES WITH TRENCH GATE STRUCTURES IN A SEMICONDUCTOR BODY WITH HEXAGONAL CRYSTAL LATTICE

(71) Applicant: Infineon Technologies AG, Neubiberg (DE)

(72) Inventors: Roland Rupp, Lauf (DE); Romain Esteve, Villach (AT); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/001,540

(22) Filed: Jun. 6, 2018

(65) Prior Publication Data

US 2018/0294260 A1 Oct. 11, 2018

Related U.S. Application Data

(63) Continuation of application No. 15/681,607, filed on Aug. 21, 2017, now Pat. No. 9,997,515, which is a (Continued)

(30) Foreign Application Priority Data

Mar. 3, 2015 (DE) .................. 10 2015 103 067

(51) Int. Cl.
*H01L 27/06* (2006.01)
*H01L 29/739* (2006.01)
(Continued)

(52) U.S. Cl.
CPC ........ *H01L 27/0664* (2013.01); *H01L 29/045* (2013.01); *H01L 29/1095* (2013.01);
(Continued)

(58) Field of Classification Search
CPC .............. H01L 29/4236; H01L 29/045; H01L 29/1608; H01L 29/7813; H01L 33/22
(Continued)

(56) References Cited

U.S. PATENT DOCUMENTS

| 6,133,587 A | 10/2000 | Takeuchi et al. |
| 2010/0193799 A1* | 8/2010 | Nakano ............... H01L 29/1608 257/77 |

(Continued)

FOREIGN PATENT DOCUMENTS

| JP | H11195788 A | 7/1999 |
| JP | 2007221012 A | 8/2007 |

(Continued)

*Primary Examiner* — Jonathan Han
(74) *Attorney, Agent, or Firm* — Slater Matsil, LLP

(57) ABSTRACT

A semiconductor device with a trench gate structure in a semiconductor body with a hexagonal crystal lattice is disclosed. In an embodiment a semiconductor device includes a semiconductor body with a hexagonal crystal lattice, wherein a mean surface plane of a first surface of the semiconductor body is tilted with respect to a <1-100> crystal direction of the hexagonal crystal lattice by an off-axis angle, a trench gate structure extending into the semiconductor body and at least two transistor mesas formed from portions of the semiconductor body and adjoining the trench gate structure, wherein sidewalls of the at least two transistor mesas are aligned with a (11-20) crystal plane and deviate from a normal to the mean surface plane by at most 5 degrees, and wherein each transistor mesa comprises a MOS gate channel.

25 Claims, 10 Drawing Sheets

Related U.S. Application Data continuation of application No. 15/053,117, filed on Feb. 25, 2016, now Pat. No. 9,741,712.

(51) Int. Cl.
*H01L 29/04* (2006.01)
*H01L 29/10* (2006.01)
*H01L 29/16* (2006.01)
*H01L 29/40* (2006.01)
*H01L 29/861* (2006.01)

(52) U.S. Cl.
CPC ...... *H01L 29/1608* (2013.01); *H01L 29/7397* (2013.01); *H01L 29/407* (2013.01); *H01L 29/8613* (2013.01)

(58) Field of Classification Search
USPC .......................................... 257/77; 438/270
See application file for complete search history.

(56) References Cited

U.S. PATENT DOCUMENTS

| | | | |
|---|---|---|---|
| 2011/0017998 A1* | 1/2011 | Nakano | H01L 21/046 257/66 |
| 2011/0117998 A1 | 5/2011 | Hirato et al. | |
| 2011/0297963 A1* | 12/2011 | Honaga | H01L 21/049 257/77 |
| 2013/0168701 A1* | 7/2013 | Kiyosawa | H01L 21/0475 257/77 |
| 2014/0014972 A1 | 1/2014 | Nakano et al. | |
| 2014/0070270 A1 | 3/2014 | Yoshida et al. | |

FOREIGN PATENT DOCUMENTS

| | | |
|---|---|---|
| JP | 2008108824 A | 5/2008 |
| JP | 2014075582 A | 4/2014 |
| JP | 2014127547 A | 7/2014 |

\* cited by examiner

SEMICONDUCTOR DEVICES WITH TRENCH GATE STRUCTURES IN A SEMICONDUCTOR BODY WITH HEXAGONAL CRYSTAL LATTICE

CROSS-REFERENCE TO RELATED APPLICATIONS

This application is a continuation of U.S. application Ser. No. 15/681,607, filed Aug. 21, 2017, entitled "Semiconductor Device with Trench Gate Structures in a Semiconductor Body with Hexagonal Crystal Lattice", which is a continuation of U.S. application Ser. No. 15/053,117, filed Feb. 25, 2016, now U.S. Pat. No. 9,741,712, issued Aug. 22, 2017, entitled "Semiconductor Device with Trench Gate Structures in a Semiconductor Body with Hexagonal Crystal Lattice", which claims priority to German Application No. 102015103067.5, filed Mar. 3, 2015, entitled "Semiconductor Device with Trench Gate Structures in a Semiconductor Body with Hexagonal Crystal Lattice", which applications are hereby incorporated herein by reference.

BACKGROUND

Power semiconductor switches withstand a blocking voltage of several hundred Volts at high current rating. Typically, a load current through a power semiconductor switch flows in a vertical direction between the two principal planes of a semiconductor body. Gate electrodes for controlling the load current may be formed in trench gate structures extending from one of the principal planes into the semiconductor body. On the other hand, semiconductor materials with hexagonal crystal lattice such as silicon carbide and gallium nitride have seen increasing interest in the use as base material for electronic circuits.

It is desirable to improve the device characteristics and device reliability of semiconductor devices with hexagonal crystal lattice.

SUMMARY

According to an embodiment a semiconductor device includes trench gate structures in a semiconductor body with hexagonal crystal lattice. A mean surface plane of a first surface is tilted to a <1-100> crystal direction by an off-axis angle, the absolute value of which is in a range from 2 degree to 12 degree. The trench gate structures extend oriented along the <1-100> crystal direction. Portions of the semiconductor body between neighboring trench gate structures form transistor mesas. Sidewalls of the transistor mesas deviate from a normal to the mean surface plane by not more than 5 degree.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description explain principles of the invention. Other embodiments of the invention and intended advantages will be readily appreciated as they become better understood by reference to the following detailed description.

DETAILED DESCRIPTION OF ILLUSTRATIVE EMBODIMENTS

Figure 1A:
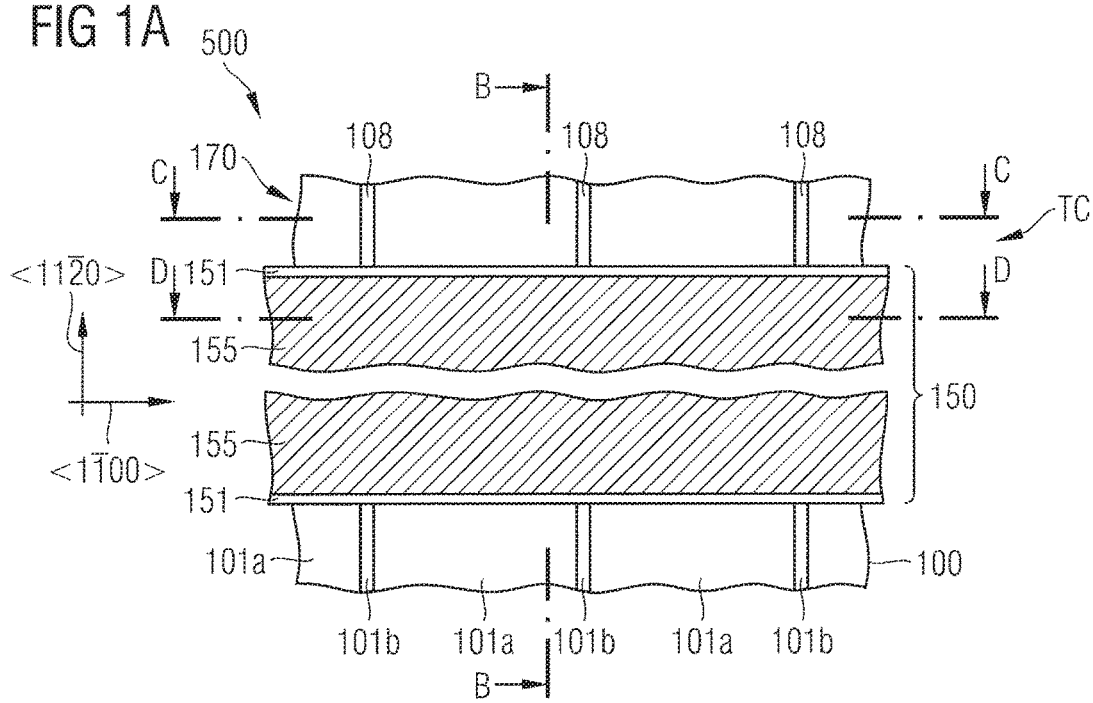
FIG. 1A is a schematic plan view of a surface portion of a semiconductor body of a semiconductor device according to an embodiment, wherein the semiconductor body has a hexagonal crystal lattice and includes a trench gate structure.

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doped region has a higher doping concentration than an "n"-doped region. Doped regions of the same relative doping concentration do not necessarily have the same absolute doping concentration. For example, two different "n"-doped regions may have the same or different absolute doping concentrations.

FIGS. 1A to 1D refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor body 100 from crystalline semiconductor material with a hexagonal crystal lattice, such as silicon carbide (SiC) or an appropriate AIIIBV semiconductor, e.g., gallium nitride (GaN). According to an embodiment, the semiconductor material is silicon carbide of the 4H polytype (4H—SiC).

At a front side the semiconductor body 100 has a first surface 101, which may be planar or which may include coplanar surface sections, wherein the planar first surface 101 or the coplanar surface sections may coincide with a main crystal plane or may be tilted to a main crystal plane by an off axis angle α, which absolute value may be at least 2 degree and at most 12 degree, e.g., about 4 degree. According to other embodiments, the first surface 101 is a serrated or "staggered" surface with parallel first surface sections 101*a* shifted to each other and tilted to a mean surface plane 101*x*, which may be given by the least squares mean plane. Second surface sections 101*b*, which are tilted to the first surface sections, connect the first surface sections 101*a*. A cross-sectional line of the serrated first surface 101 is saw-toothed. On the back, an opposite second surface 102 may extend parallel or tilted to the mean surface plane 101*x* or may include parallel surface sections parallel to the first and second surface sections 101*a*, 101*b* of the first surface 101.

A distance between the first surface 101 at the front side and the second surface 102 on the back is related to a nominal blocking voltage the semiconductor device 500 is specified for. Typically, the semiconductor body 100 includes a first vertical portion that accommodates the applied electric field in the blocking state, wherein the thickness of the first portion is proportional to the nominal blocking voltage and defines the electric field breakdown strength, whereas the thickness of further vertical portions, e.g., a substrate portion, is not related to the nominal blocking voltage.

A total thickness of the semiconductor body 100 between the first and second surfaces 101, 102 may be in the range of several μm to several hundred μm. The normal to the mean surface plane 101*x* defines a vertical direction. Directions parallel to the first surface 101 are horizontal directions.

The transistor cells TC are formed along trench gate structures 150. A longitudinal extension of the trench gate structures 150 along a first horizontal direction may be greater than a width along a second horizontal direction orthogonal to the first horizontal direction. The trench gate structures 150 may be long stripes extending from one side of a transistor cell area to an opposite side. According to other embodiments a plurality of separated trench gate structures 150 may be arranged along a line extending from one side of the transistor cell area to the opposite side, or the trench gate structures 150 may form a grid with portions of the semiconductor body 100 formed in the meshes of the grid.

The trench gate structures 150 may be equally spaced, may have equal width, and may form a regular pattern, wherein a pitch (center-to-center) of the trench gate structures 150 may be in a range from 1 μm to 10 μm, e.g., from 2 μm to 5 μm. A vertical extension of the trench gate structures 150 may be in a range from 0.3 μm to 5 μm, e.g., in a range from 0.5 μm to 2 μm.

The trench gate structures 150 include a conductive gate electrode 155 which may include or consist of a heavily doped polycrystalline silicon layer or a metal-containing layer. The trench gate structures 150 further include a gate dielectric 151 separating the gate electrode 155 from the semiconductor body 100. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.5 V to 6 V. In end portions of the trench gate structures 150 the gate dielectric 151 may be thicker than in active portions of the transistor cells 170 to improve device reliability. According to an embodiment, the end portions may be completely filled with a dielectric material such as silicon oxide.

All or some of the mesa portions of the semiconductor body 100 between neighboring trench gate structures 150 form transistor mesas 170 that include semiconducting portions of the transistor cells TC. The mesa portions may also include diode mesas including at least portions of a body diode.

The transistor mesas 170 include source zones 110 that are oriented to the front side and that may directly adjoin the first surface 101. In each transistor mesa 170 one or two source zones 110 directly adjoin both neighboring trench gate structures 150. For example, the transistor mesa 170 may include two separated source zones 110, which extend on opposite sides of an intermediate mesa contact structure between the mesa contact structure and one of the neighboring trench gate structures 150, respectively. According to another embodiment, the source zones no may extend from one of the trench gate structures 150 adjoining the concerned transistor mesa 170 to the other, opposite trench gate structure 150.

The transistor mesas 170 further include body zones 115 that separate the source zones 110 from a drift structure 120, wherein the body zones 115 form first pn junctions pn1 with the drift structure 120 and second pn junctions pn2 with the source zones 110. A vertical extension of the body zones 115 corresponds to a channel length of the transistor cells TC and may be in a range from 0.2 μm to 1.5 μm.

Each body zone 115 may extend from one of the trench gate structures 150 adjoining the concerned transistor mesa 170 to the other, opposite trench gate structure 150, or two body zones 115 may extend on opposite sides of an intermediate mesa contact structure between the mesa contact structure and one of the neighboring trench gate structures 150, respectively. Portions of the body zones 115 are capacitively coupled to the gate electrode 155 through the gate dielectric 151.

Both the first pn junctions pn1 and the second pn junction pn2 may extend over the whole width of the transistor mesa 170 between the two trench gate structures 150 sandwiching the concerned transistor mesa 170. Both the source zones no and the body zones 115 are electrically connected to a first load electrode 310 at the front side.

The semiconductor body 100 may further include diode regions 116 forming third pn junctions pn3 with a drift structure 120. The diode regions 116 are electrically connected or coupled to the first load electrode 310 and may vertically overlap with the trench gate structures 150 such that portions of the diode regions 116 are formed in the vertical projection of the trench gate structures 150. A distance between opposing edges of neighboring diode regions 116 may be in a range from 2 μm to 3 μm, by way of example.

The drift structure 120 is oriented to the back, may directly adjoin the second surface 102 and may be electrically connected or coupled to a second load electrode 320 through an ohmic contact or a further pn junction. The drift structure 120 may include a lightly doped drift zone 121 that may form the first and third pn junctions pn1, pn3 as well as a heavily doped contact layer 129 between the drift zone 121 and the second surface 102. The net dopant concentration in the drift zone 121 may be in a range from 1E14 cm-3 to 3E16 cm-3 in case the semiconductor body 100 is formed from silicon carbide.

A mean dopant concentration in the contact layer 129 is sufficiently high to ensure an ohmic contact with a second load electrode 320 that directly adjoins the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), Vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal L1, which may be an anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

According to an embodiment, the transistor cells TC are n-channel FET cells with p-doped body zones 115 and n-doped source zones 110, wherein the diode regions 116 are p-doped and the drift zone 121 is n-doped. According to another embodiment, the transistor cells TC are p-channel FET cells with n-doped body zones 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones no with the drift structure 120, thereby turning on the semiconductor device 500. In the on-state, a load current flows through the semiconductor body 100 approximately along the vertical direction between the first and second load electrodes 310, 320.

Figure 1B:
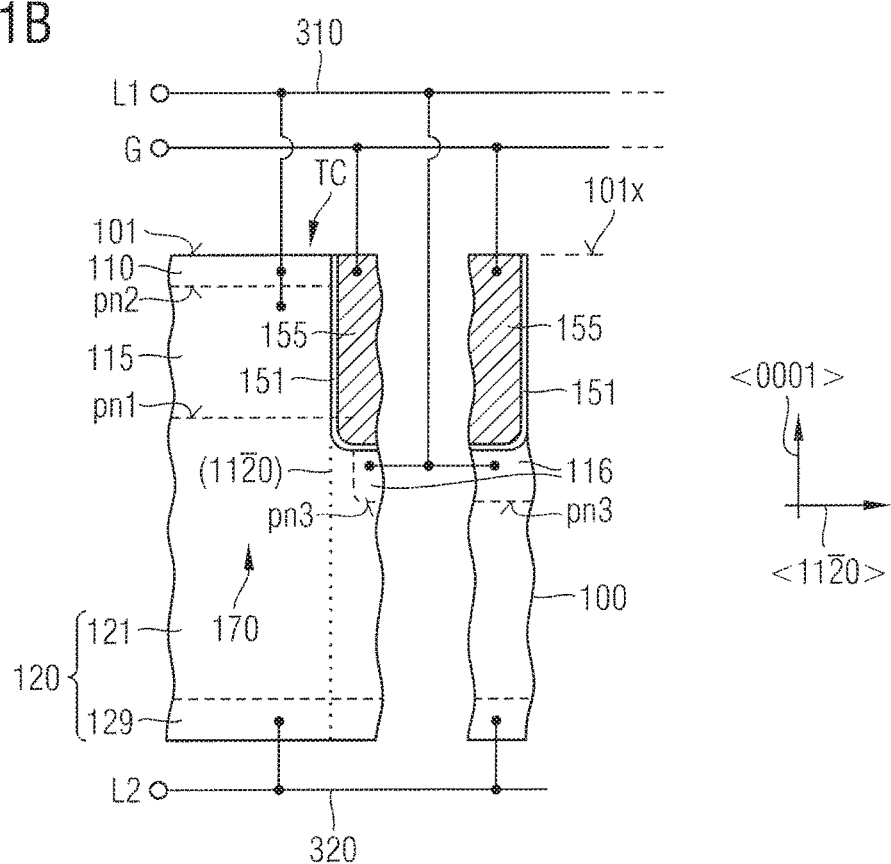
FIG. 1B is a schematic vertical cross-sectional view of the semiconductor device portion of FIG. 1A along line B-B intersecting a longitudinal axis of the trench gate structure.
Figure 1C:
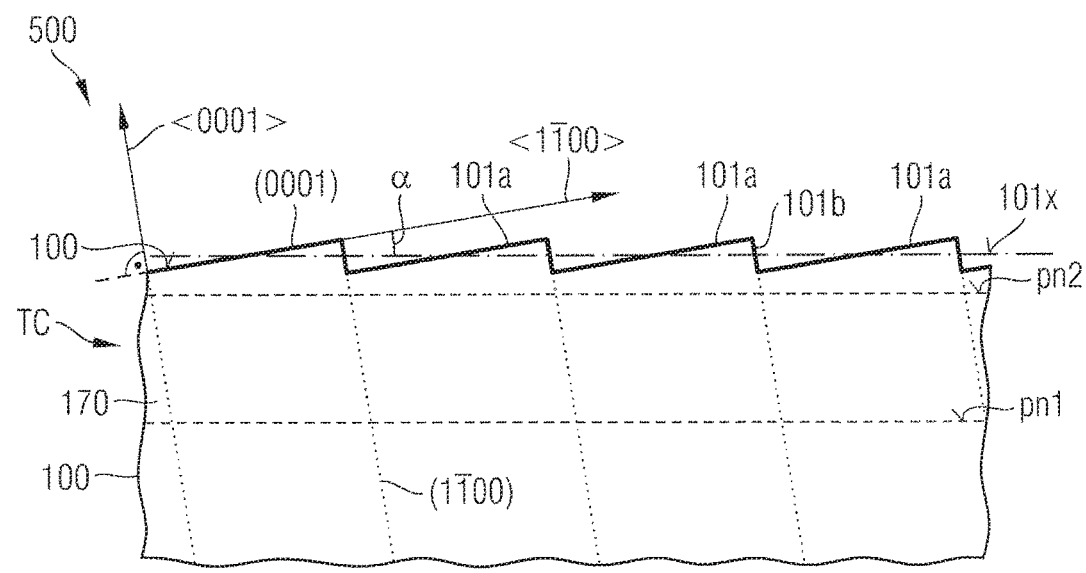
FIG. 1C is a schematic vertical cross-sectional view of the semiconductor device portion of FIG. 1A along line C-C through a transistor mesa and parallel to a longitudinal axis of the trench gate structure.
Figure 1D:
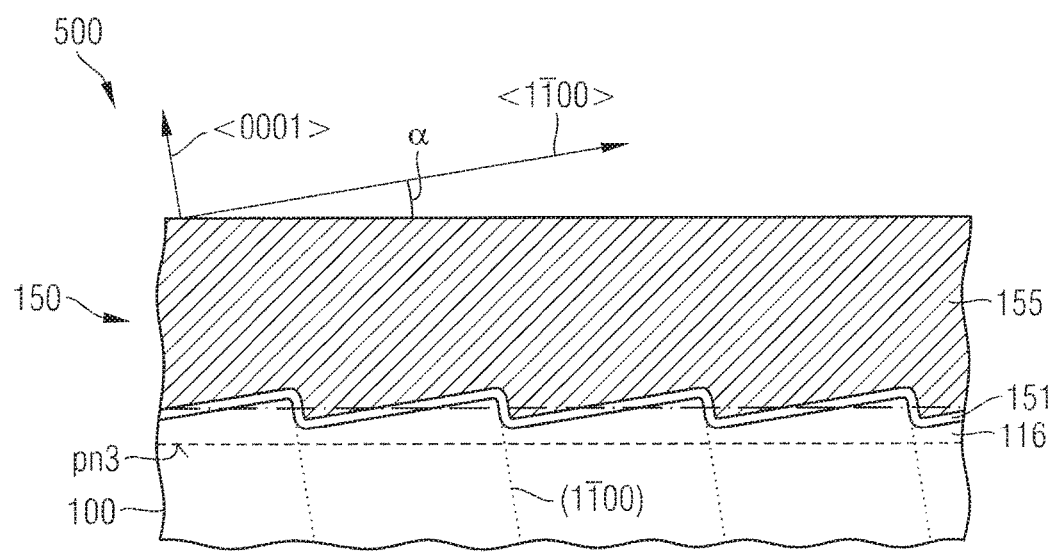
FIG. 1D is a schematic vertical cross-sectional view of the semiconductor device portion of FIG. 1A along line D-D along the longitudinal axis of the trench gate structure.

As illustrated in FIGS. 1A and 1C the first surface 101 may be a serrated surface with long flat first surface sections 101a that are (0001) crystal planes and short, steep second surface sections 101b tilted to the first surface sections 101a by an angle greater 0 degree, e.g., about 90 degree and connecting the first surface sections 101a. The second surface sections 101b may be <1-100> crystal planes. Steps 108 formed along the edges between first and second surface sections 101a, 101b run parallel to the <11-20> crystal direction as illustrated in FIG. 1A.

According to another embodiment, the first surface 101 may be planar and tilted to a main crystal plane, e.g., the (0001) crystal plane by an off-axis angle of at least 2 degree, e.g., about 4 degree or at least −2 degree, e.g., about −4 degree. In this case, a mean surface plane 101x defined by the least squares mean plane coincides with the first surface 101.

The serrated first surface 101 results from cutting a crystal ingot at an off-axis angle α with respect to the <1-100> crystal direction. The off-axis angle α between the cut plane and the <1-100> crystal direction may be any angle in a range from about 2 to 12 degree or −2 to −12 degree, for example in a range from 3 to 8 degree or −3 to −8 degree. According to an embodiment the off-axis angle α is approximately 4 degree or −4 degree. The cut plane may coincide with or is parallel to a mean surface plane 101x of the first surface 101. In case of equidistant steps 108, the mean surface plane 101x, which is defined by the least square mean plane, cuts the first and second surface sections 101a, 101b at the half step size.

A serrated substrate surface facilitates step controlled epitaxy during which silicon and carbon atoms impinge on the serrated substrate surface and start ordered crystal growth at the steps. A top surface of an epitaxial layer grown on the serrated substrate surface of a 4H—SiC wafer used as substrate for the epitaxy images the serrated substrate surface of the 4H—SiC wafer substrate. A chemical-mechanical polishing may planarize the serrated surface and a passivation layer, e.g., a carbon layer, may suppress redeposition of the silicon and carbon atoms along main crystal planes during following heating processes.

With the mean surface plane 101x of the semiconductor body 100 tilted against the <1-100> crystal direction instead tilted against the <11-20> crystal direction and with the trench gate structures 150 extending oriented along the <1-100> crystal direction, the longitudinal axes of the trench gate structures 150 are parallel to a vertical projection of the <1-100> crystal direction onto the mean surface plane 101x and deviate from the vertical projection of the <1-100> crystal direction by not more than 5 degree or at most 2 degree. The sidewalls of the trench gate structures 150, which run orthogonal to the steps 108, are (11-20) and (−1-120) crystal planes and deviate from a normal to the mean surface plane 101x, i.e., the vertical direction, by not more than 5 degree. According to an embodiment, the sidewalls extend vertically to the mean surface plane 101x as shown in FIG. 1B.

Since along both sidewalls the charge carrier mobility is the same, symmetric transistor cell layouts may use both sides of the trench gate structures 150 for forming MOS gated channels through the body zones 115. Even if process fluctuations result in slightly tapered trench gate structures 150 with sidewalls deviating by up to 5 degree from the vertical direction, the resulting angular misalignment between the sidewalls of the transistor mesas 170 and the (11-20), (−1-120) crystal planes is approximately equal such that on both sides of the trench gate structures 150 electron mobility and threshold voltage are the same. As a consequence, in case the transistor cells TC are turned on a current distribution is uniform across the semiconductor body 100.

Figure 2:
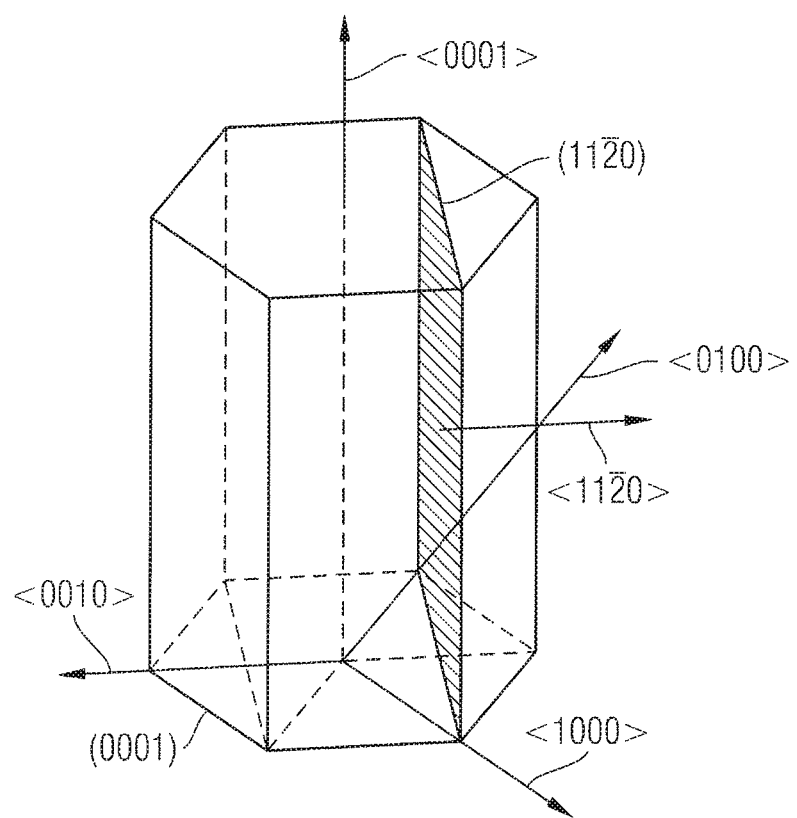
FIG. 2 schematically shows a lattice cell of a hexagonal crystal lattice for discussing effects of the embodiments.

FIG. 2 shows the crystal planes and crystal directions in a lattice cell of a hexagonal crystal of 4H—SiC with the principal <0001> crystal direction perpendicular to the (0001) basal plane or C-plane. Crystal planes with high charge carrier mobility are the {1-100} crystal planes or M-planes and the {11-20} crystal planes or A-planes, wherein the charge carrier mobility in the {11-20} crystal planes may be about 20% higher than in the {1-100} crystal planes. The A-planes are members of a set of planes including the (11-20), (1-210), (−2110), (2-1-10), (−12-10) and (−1-120) crystal planes and the following description refers to the (11-20) crystal plane as an arbitrary one of the A-planes.

Figure 3A:
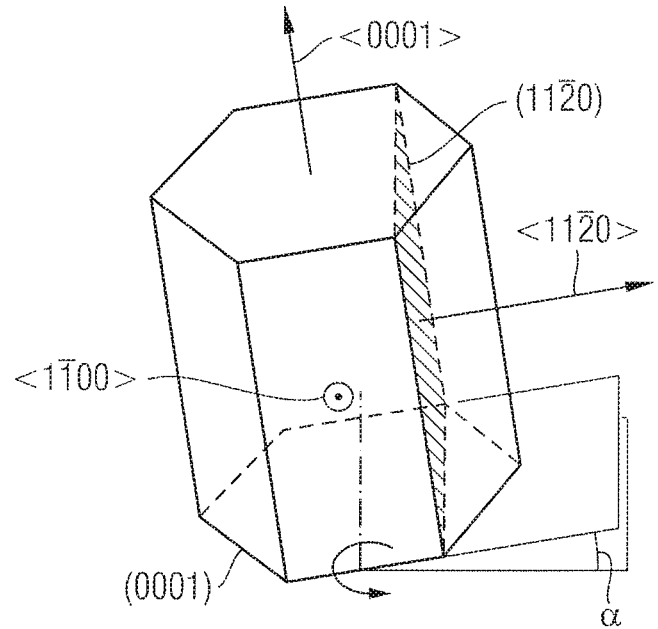
FIG. 3A is a schematic perspective view illustrating the crystal orientations in a lattice cell of a hexagonal crystal lattice with the <0001> crystal direction tilted with respect to a mean surface plane in direction of the <11-20> crystal planes for discussing effects of the embodiments.
Figure 3B:
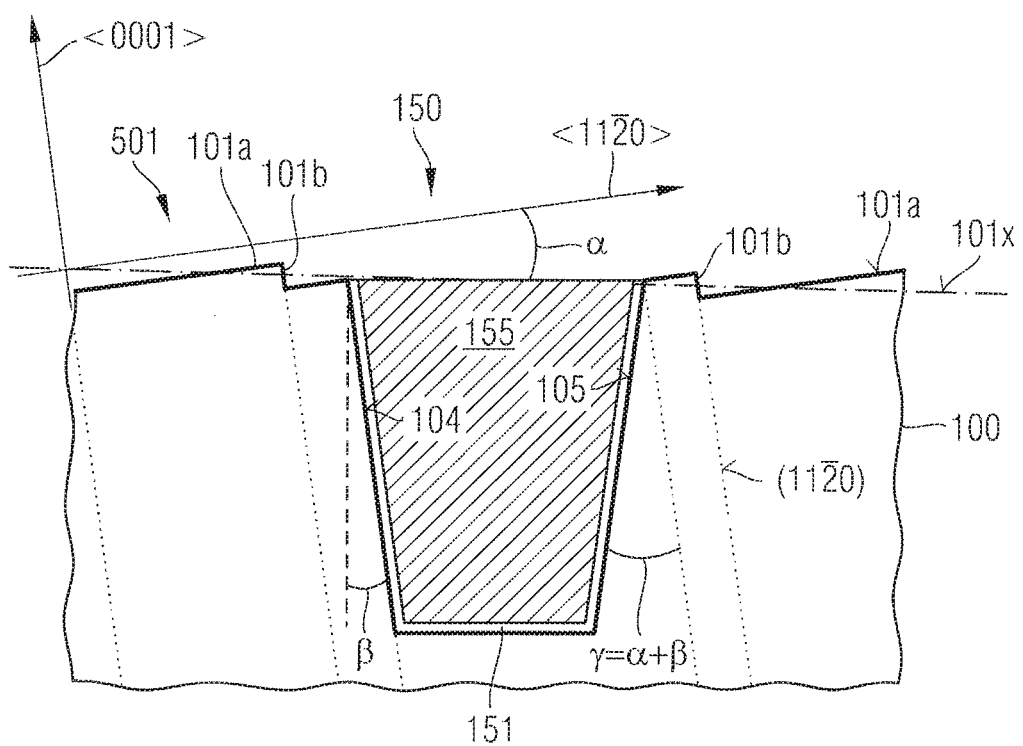
FIG. 3B is a schematic cross-sectional view of a portion of a semiconductor body including a trench gate structure, wherein a mean surface plane of the semiconductor body is tilted to the <11-20> crystal direction.

FIGS. 3A and 3B refer to conventional silicon carbide devices. Typically, a surface of a SiC semiconductor device has an off-axis angle α of 4 degree with respect to the <11-20> crystal direction.

For example, a 4H—SiC crystal ingot is cut at an off-axis angle in a range from 2 degree to 8 degree with respect to the <11-20> crystal direction to obtain a wafer substrate. During a thermal treatment of the wafer substrate, silicon and carbon atoms rearrange along the crystal directions such that a serrated surface is formed with long flat first surface sections parallel to the <11-20> crystal direction. Short steep second surface sections, which may be (11-20) crystal planes, connect the first surface sections with each other. When an epitaxial layer is grown on the serrated wafer surface by step-controlled epitaxy, the edges at the steps between first and second surface sections order the impinging silicon and carbon atoms in a way such that the grown epitaxial layer continues the 4H—SiC crystal structure.

FIG. 3A shows the resulting orientation of a lattice cell in a semiconductor body obtained from the process described above. The <0001> crystal direction declines into the direction of the (11-20) crystal planes and both are tilted with respect to a horizontal line.

FIG. 3B shows a trench gate structure 150 that extends from a front side into a semiconductor body 100. A serrated first surface 101a of the semiconductor body 100 includes long flat first surface sections 101a parallel to the <11-20> crystal direction. Short steep second surface sections 101b, which may be (11-20) crystal planes, connect the first surface sections 101a with each other. The steps in the first surface 101 may be approximately symmetric with respect to a mean surface plane 101x, which is tilted to the <11-20> crystal direction at the off-axis angle α.

The trench gate structure 150 tapers with increasing distance to the top surface 101a at a taper angle β with respect to the vertical direction. If the taper angle β and the off-axis angle α are equal, a first sidewall 104 of the trench gate structure 150 is a (11-20) crystal plane, whereas an opposite second sidewall 105 is tilted to the (11-20) crystal planes by an angular misalignment γ=α+β. Since electron mobility and threshold voltage strongly depend on the crystal orientation, an inversion channel formed along the second sidewall 105 is significantly less effective than an inversion channel formed along the first sidewall 104.

In addition, the first and second sidewalls 104, 105 are only smooth and without steps if the horizontal direction along which they extend is perfectly parallel to the (11-20) crystal planes. At a slight angular misalignment between the crystal planes and the longitudinal axes of the trench gate structure 150, the first and second sidewalls 104, 105 cut the (11-20) crystal planes. A high temperature anneal performed after formation of trench may form steps compensating the deviation of the longitudinal axes of the trench from the (11-20) crystal planes. The steps in turn may locally change the characteristics of the inversion channels and may degrade device reliability.

Figure 4A:
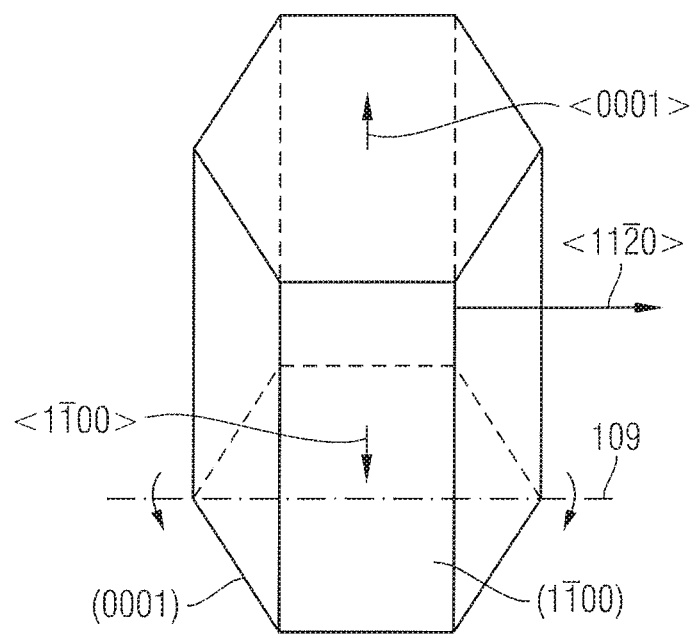
FIG. 4A is a schematic perspective view illustrating the crystal orientations in a lattice cell of a hexagonal crystal lattice with the <0001> crystal direction tilted with respect to a mean surface plane in direction of the <1-100> crystal planes for discussing effects of the embodiments.
Figure 4B:
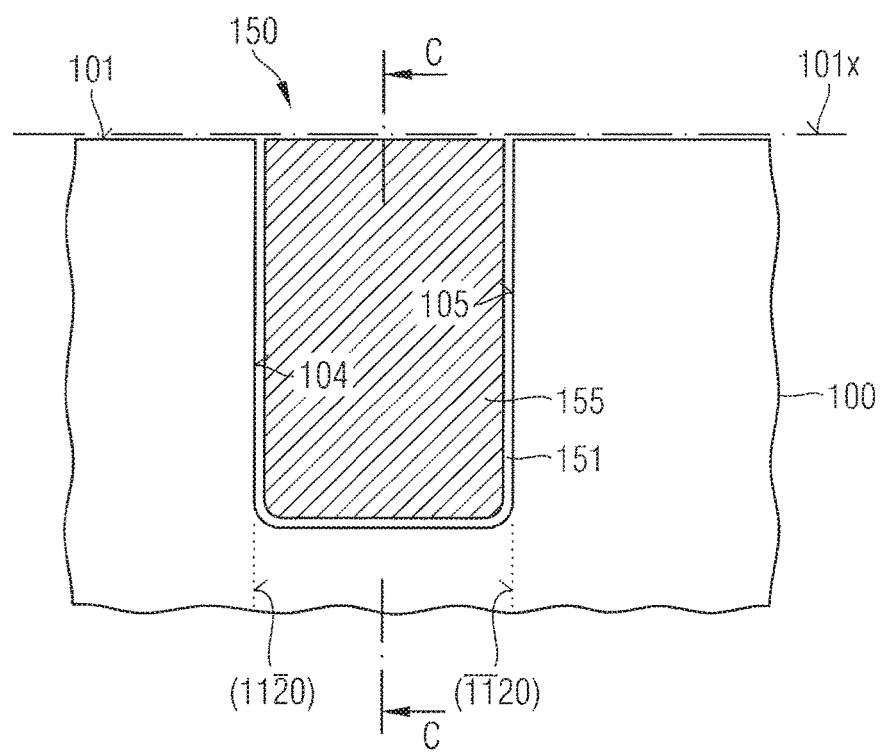
FIG. 4B is a schematic vertical cross-sectional view of a portion of a semiconductor body including a trench gate structure, wherein a mean surface plane of the semiconductor body is tilted to the <1-100> crystal direction.
Figure 4C:
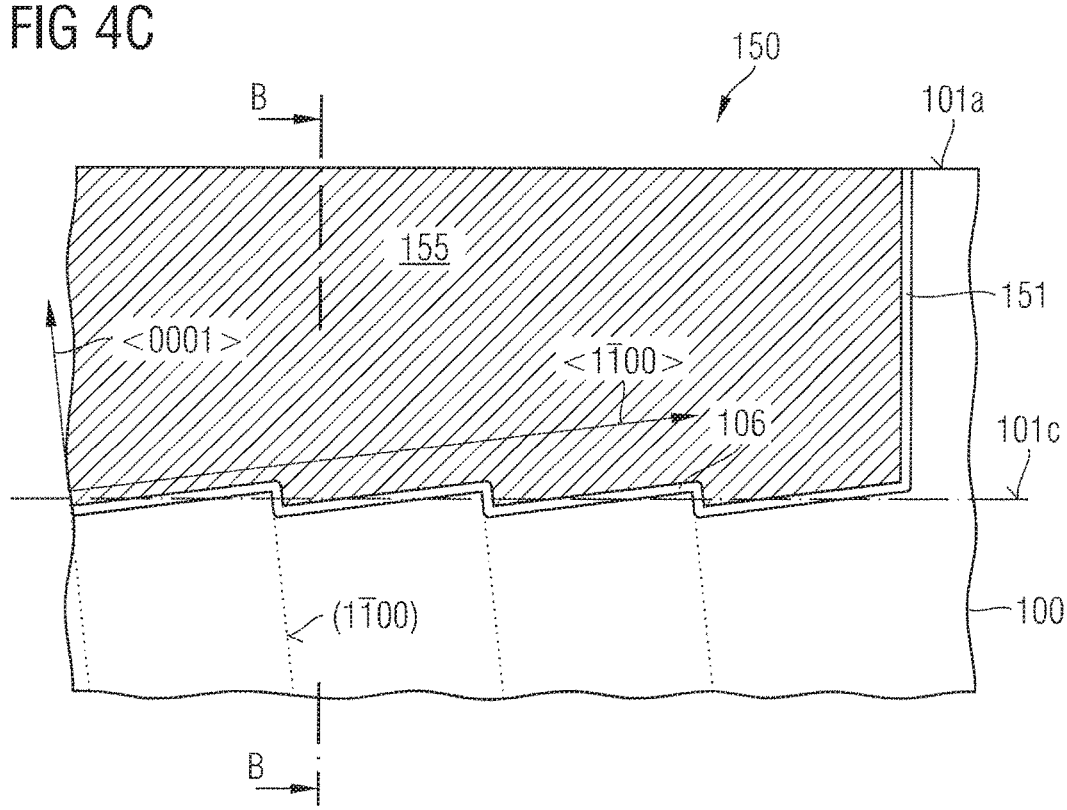
FIG. 4C is a schematic vertical cross-sectional view of the semiconductor device portion of FIG. 4B along line C-C.

FIGS. 4A to 4C illustrate the orientation of trench gate structures with respect to the crystal directions according to the embodiments. Instead of cutting a wafer with an off-axis angle α tilted to the <11-20> crystal direction, the wafer is cut with an off-axis angle tilted to the <1-100> crystal direction which is orthogonal to the <11-20> crystal direction. In other words, while conventionally the <0001> crystal direction declines in direction of the (11-20) crystal planes, the embodiments are based on a crystal with the <0001> crystal direction declining into direction of the <1-100> crystal planes.

FIG. 4A shows the resulting orientation of a lattice cell in a semiconductor body obtained from the process described above. The lattice cell is tilted around the tilt axis 109 towards the viewer such that the <0001> crystal direction as well as the (1-100) crystal planes are tilted outwardly of the drawing plane into the direction of the viewer. The orientation of the (11-20) crystal planes remains orthogonal to the drawing plane.

As illustrated in FIGS. 4B and 4C, the semiconductor body 100 with trench gate structures 150 and transistor mesas 170 as illustrated in FIGS. 1A to 1D is obtained from a wafer of a single crystalline material having a hexagonal crystal structure, wherein a mean surface plane 101x of a serrated first surface 101 has an off-axis angle α with respect to the <1-100> crystal direction. The trench gate structures 150 extend along the <1-100> crystal direction such that vertical sidewalls of the transistor mesas 170 are {11-20} crystal planes, e.g., (11-20) and (-1-120) crystal planes. Both sidewalls 104, 105 have identical surface properties such that both trench gate sidewalls 104, 105 are identical with respect to charge carrier mobility. Along both sidewalls 104, 105 a current density is equal and overall current distribution is more uniform. Even at a minor taper of the trench gate structures 105, the effect of the tapering is the same on both sidewalls 104, 105 such that a uniform current distribution can be achieved even when process fluctuations cause slightly tapered sidewalls 104, 105.

Figure 5A:
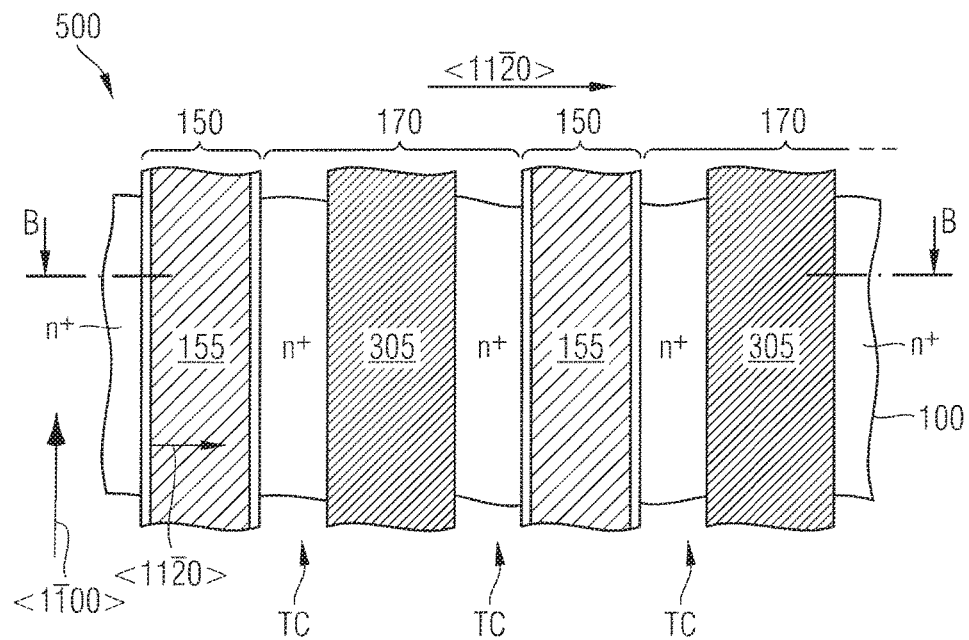
FIG. 5A is a schematic horizontal cross-sectional view of a portion of a semiconductor device according to an embodiment related to deep mesa contact structures.
Figure 5B:
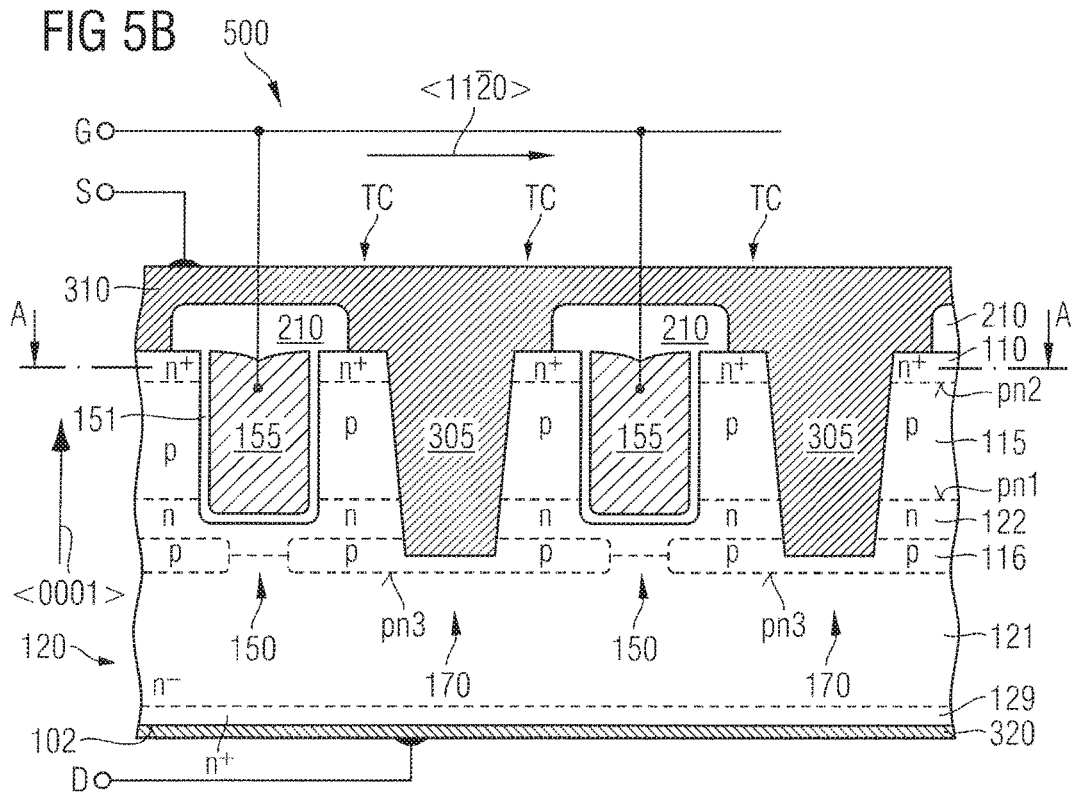
FIG. 5B is a schematic vertical cross-sectional view of the semiconductor device portion of FIG. 5A along line B-B.

The semiconductor device 500 of FIGS. 5A and 5B is a silicon carbide IGFET based on the semiconductor device 500 of FIGS. 1A to 1D, wherein the first load electrode 310 forms or is electrically connected or coupled to a source terminal S and the second load electrode 320 forms or is electrically connected to a drain terminal D.

In FIG. 5A the principal <0001> crystal direction is slightly tilted to the perpendicular on the drawing plane. The <1-100> crystal direction runs parallel to the trench gate structures 150 and is slightly tilted to the drawing plane by the off-axis angle α. Vertical sidewalls of the transistor mesas 170 are {11-20} crystal planes like (11-20) and (-1-120) crystal planes.

In FIG. 5B the <0001> crystal direction is tilted by the off-axis angle α to the drawing plane and the <1-100> crystal direction is tilted by the off-axis angle α to the perpendicular onto the drawing plane.

The trench gate structures 150 are stripes and may orthogonally intersect steps that may be formed between staggered surface sections at the first surface 101. According to another embodiment, the first surface 101 may be planar. The trench gate structures 150 may be equally spaced from each other, may have uniform width and may extend from one side of a transistor cell area to the opposite side. Mesa contact structures 305 extend from the first surface 101 into the transistor mesas 170. According to the illustrated embodiment the mesa contact structures 305 have a greater vertical extension than the trench gate structures 150 and directly adjoin diode regions 116 formed at least in the vertical projection of the transistor mesas 170 between the transistor mesas 170 and the second surface 102. The diode regions 116 form third pn junctions pn3 with the drift structure 120 and provide a fly back diode functionality integrated in the semiconductor device 500. Portions of the diode regions 116 may overlap with the vertical projection of the trench gate structures 150 and may shield active portions of the gate dielectric 151 against the high potential of the second load electrode 320 in the blocking state of the semiconductor device 500.

The drift structure 120 may include current spread zones 122 which may directly adjoin the body zones 115. The current spread zones 122 may extend between neighboring diode regions 116. Unipolar homojunctions between the current spread zones 122 and the drift zone 121 may have a greater distance to the first surface 101 than the third pn junctions pn3 formed between the diode regions 116 and the drift zone 121. A mean net dopant concentration in the current spread zones 122 is at least ten times as high as a mean net dopant concentration in the drift zone 121. Portions of the current spread zones 122 may overlap with the vertical projection of the diode regions 116 and may extend between neighboring diode regions 116.

The mesa contact structure 305 splits the transistor mesa 170 in two portions on both sides of the intermediate mesa contact structure 305, wherein each portion may include the semiconducting portion of a transistor cell TC. According to other embodiments, the vertical extension of the mesa contact structures 305 may be smaller than the vertical extension of the trench gate structures 150 such that the mesa contact structures 305 do not completely partition the body zones 115. Then, a heavily doped contact region of the conductivity type of the diode region 116 may be formed in the vertical projection of the mesa contact structure 305 to electrically connect the concerned diode region 116 through the mesa contact structure 305 with the first load electrode 310.

An interlayer dielectric 210 sandwiched between the first load electrode 310 and the gate electrode 155 dielectrically insulates the first load electrode 310 from the gate electrode 155. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example. For further details reference is made to the description of the previous figures.

Figure 6A:
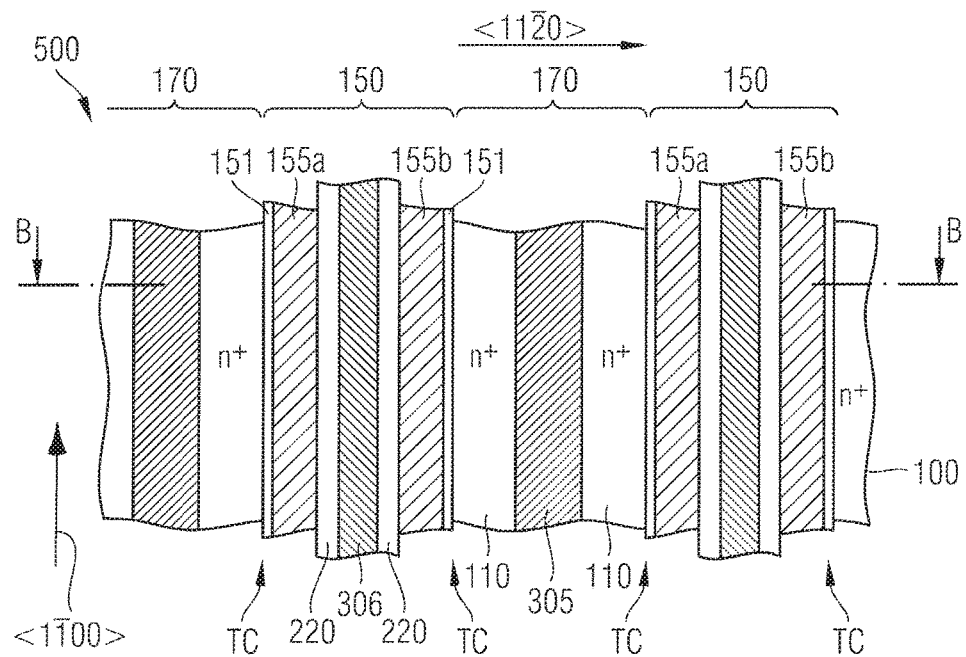
FIG. 6A is a schematic horizontal cross-sectional view of a portion of a semiconductor device according to an embodiment related to deep trench contact structures extending through the trench gate structures.
Figure 6B:
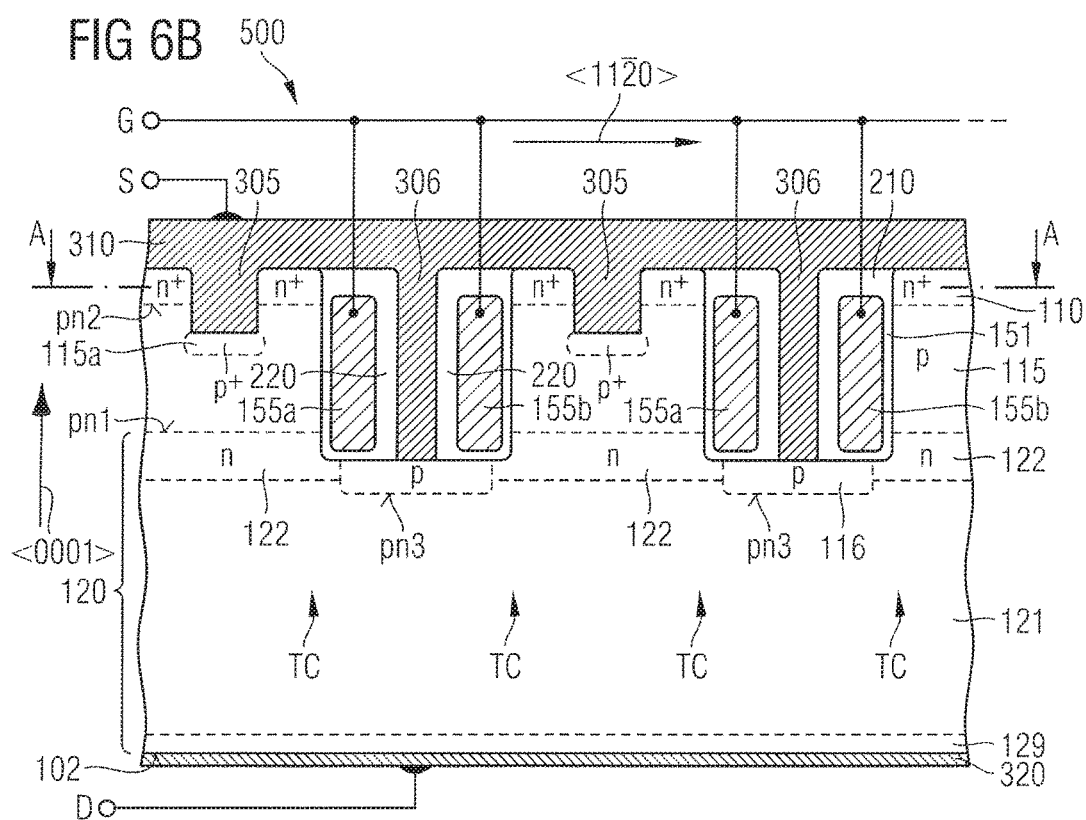
FIG. 6B is a schematic vertical cross-sectional view of the semiconductor device portion of FIG. 6A along line B-B.

In FIG. 6A, the crystal directions are the same as in FIG. 5A and in FIG. 6B the same as in FIG. 5B.

Deep trench contact structures 306 extend from the first load electrode 310 through the trench gate structures 150 and directly adjoin diode regions 116 formed in the vertical projection of the trench gate structures 150. The trench contact structures 306 partition the trench gate structures 150 into spacer portions on opposite sides of the intermediate trench gate structure 306. Contact insulator structures 220 are sandwiched between the trench contact structures 306 and adjoining spacer portions 155a, 155b of the gate electrode 155. In addition, mesa contact structures 305 extend from the first surface into the transistor mesas 170 and are electrically connected to the source zones 110 and, through heavily doped contact zones 115a, to the body zones 115.

FIGS. 7A to 7D illustrate a semiconductor device 500 with shielding portions 116b of diode regions 116 forming a layer with point-symmetric openings centered to transistor mesas 170 which alternate with diode mesas 180 along at least the first horizontal direction.

Figure 7A:
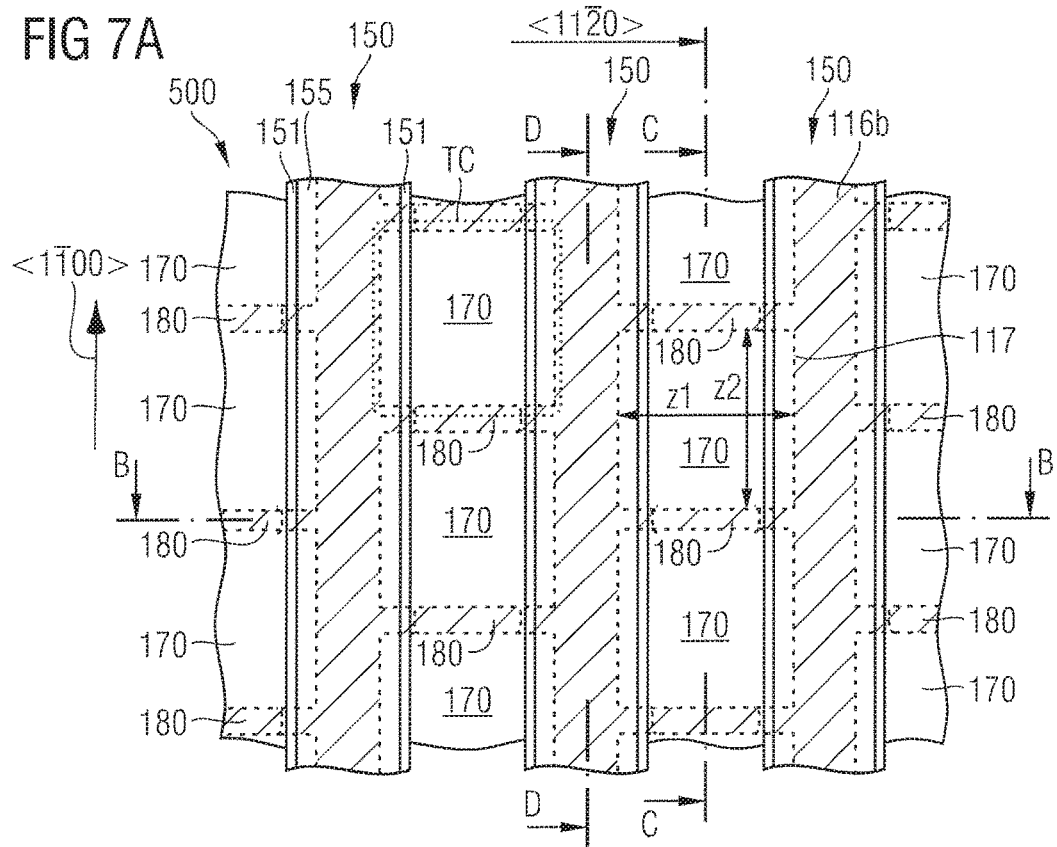
FIG. 7A is a schematic horizontal cross-sectional view of a portion of a semiconductor device according to an embodiment related to transistor and diode mesas alternating along a direction parallel to longitudinal axes of the trench gate structures.
Figure 7B:
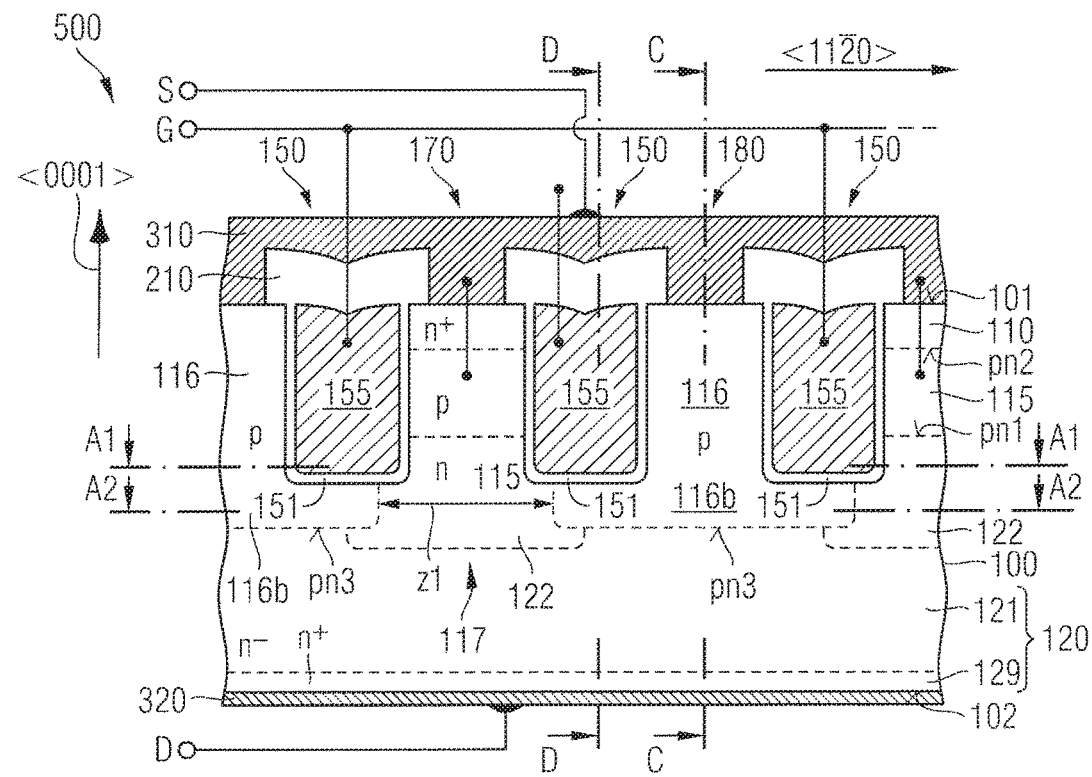
FIG. 7B is a schematic cross-sectional view of the semiconductor device portion of FIG. 7A along line B-B orthogonal to trench gate structures.
Figure 7C:
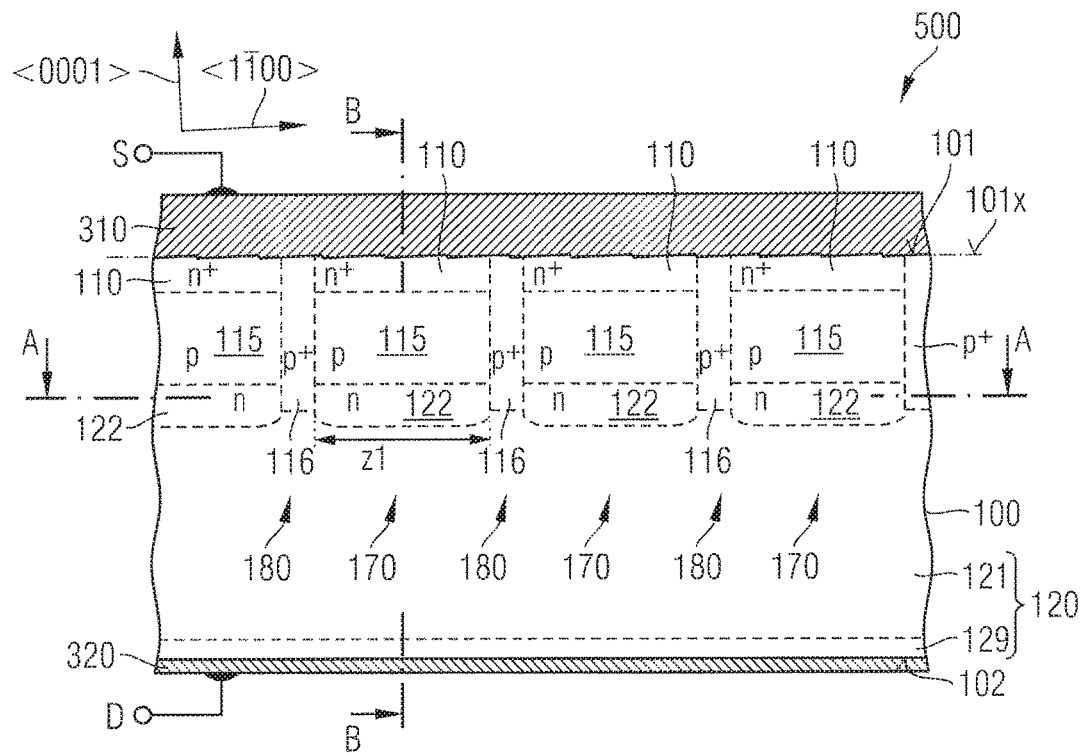
FIG. 7C is a schematic cross-sectional view of the semiconductor device portion of FIG. 7A along line C-C parallel to the trench gate structures and through diode and transistor mesas.
Figure 7D:
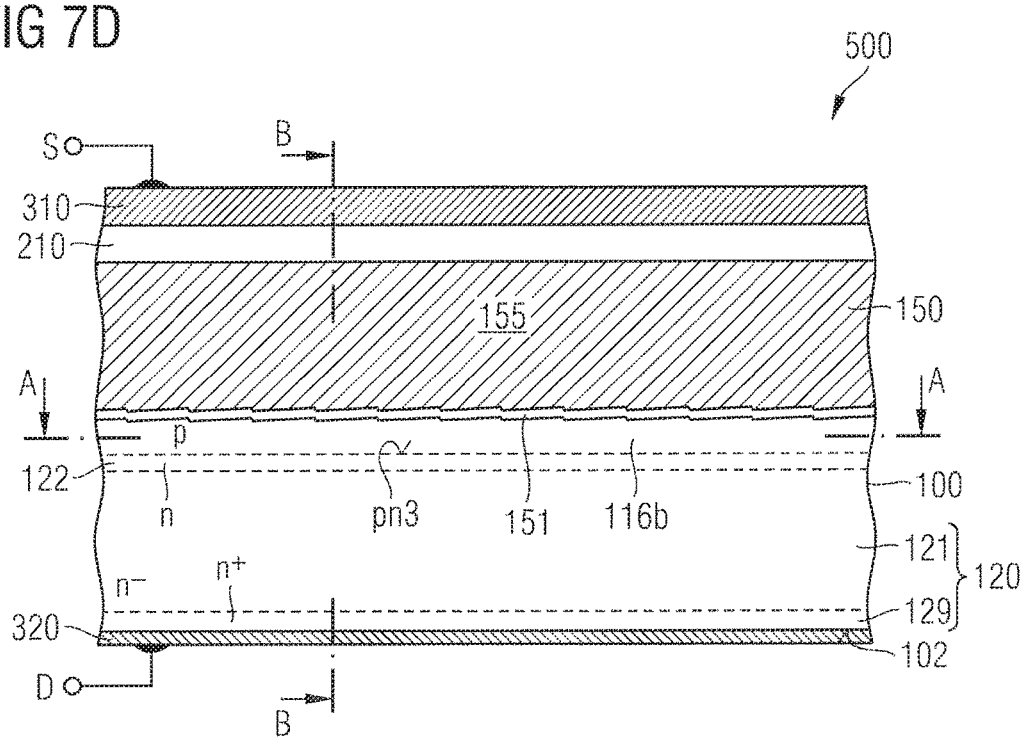
FIG. 7D is a schematic vertical cross-sectional view of the semiconductor device portion of FIG. 7A along line D-D parallel to and through trench gate structures.

The orientation of the crystal directions in FIG. 7A is the same as in FIGS. 5A and 6A and is in FIG. 7B the same as in FIGS. 5B and 6B.

In addition to the transistor mesas 170, the semiconductor body 100 includes diode mesas 180, wherein each diode mesa includes at least a portion of a diode region 116. The diode region 116 of a diode mesa 180 extends from one of the neighboring trench gate structure 150 to the opposite one. The diode regions 116 may include portions outside the mesa portions formed between neighboring trench gate structures 150, wherein a vertical extension of the diode regions 116 is greater than a vertical extension of the trench gate structures 150. The diode regions 116 may vertically overlap with the trench gate structures 150 such that shielding portions 116b of the diode regions 116 are formed in the vertical projection of the trench gate structures 150 and are spaced from the transistor mesas 170 along the horizontal direction. In the transistor mesas 170 both the source zones 110 and the body zones 115 may extend from one neighboring trench gate structure 150 to the opposite trench gate structure 150.

The transistor mesas 170 and the diode mesas 180 alternate along the first horizontal direction or along both the first horizontal direction and the second horizontal direction as illustrated. Neighboring transistor and diode mesas 170, 180 directly adjoin to each other along the first horizontal direction and are separated from each other by intermediate trench gate structures 150 along the second horizontal direction.

The shielding portions 116b of the diode regions 116 may form a contiguous layer between the bottom of the trench gate structures 150 and the second surface 102. The contiguous layer has openings 117 centered to the transistor mesas 170. A width z1 of the openings 117 orthogonal to the first horizontal direction may be equal to a width z2 of the openings 117 along the first horizontal direction.

In the blocking mode depletion zones extend from all four horizontal directions into the direction of the transistor mesas 170 and effectively shield the active portions of the gate dielectric 151 against a high electric field caused by the blocking voltage. The openings may be point-symmetric, for examples squares, octagons or other regular polygons, or circles. As regards further details, reference is made to the description of the previous Figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor body with a hexagonal crystal lattice, wherein a mean surface plane of a first surface of the semiconductor body is tilted with respect to a <1-100> crystal direction of the hexagonal crystal lattice by an off-axis angle, wherein an absolute value of the off-axis angle is in a range from 2 degrees to 12 degrees;
   a plurality of trench gate structures extending into the semiconductor body, wherein trench sidewalls of the plurality of trench gate structures are aligned with a (11-20) crystal plane of the hexagonal crystal lattice; and
   a plurality of transistor mesas formed in the semiconductor body between neighboring trench gate structures of the plurality of trench gate structures, wherein sidewalls of the plurality of transistor mesas deviate from a normal to the mean surface plane by at most 5 degrees, and
   wherein each trench gate structure adjoins a first MOS gate channel in a first body zone of a first transistor mesa neighboring the trench gate structure and a second MOS gate channel in a second body zone of a second transistor mesa neighboring the trench gate structure.

2. The semiconductor device of claim 1, wherein the first surface is a serrated surface comprising first surface sections formed by (1-100) crystal planes and second surface sections that are tilted with respect to the first sections and that connect the first surface sections with each other.

3. The semiconductor device of claim 1, wherein the off-axis angle is in a range from 3 to 8 degrees or from −3 to −8 degrees.

4. The semiconductor device of claim 1, wherein the plurality of trench gate structures are stripe-shaped with a longitudinal axis parallel to a projection of the <1-100> crystal direction on the mean surface plane.

5. The semiconductor device of claim 1, wherein the semiconductor body comprises silicon carbide of the 4H polytype.

6. The semiconductor device of claim 1, wherein the plurality of transistor mesas comprise body zones forming first pn junctions with a drift structure and second pn junctions with source zones, the source zones formed between the body zones and the first surface.

7. The semiconductor device of claim 1, further comprising diode regions forming third pn junctions with a drift structure and overlapping with neighboring trench gate structures of the plurality of trench gate structures in a vertical projection orthogonal to the mean surface plane.

8. The semiconductor device of claim 7, further comprising trench contact structures extending from the first surface through the plurality of trench gate structures and directly adjoining the diode regions.

9. The semiconductor device of claim 8, wherein a vertical extension of the trench contact structures is equal to or greater than a vertical extension of the plurality of trench gate structures.

10. The semiconductor device of claim 8, wherein each of the plurality of trench gate structures include first spacer portions and second spacer portions of a gate electrode on opposite sides of the respective trench contact structures.

11. The semiconductor device of claim 8, further comprising mesa contact structures extending from the mean surface plane into the plurality of transistor mesas and directly adjoining source zones and the body zones.

12. The semiconductor device of claim 1, further comprising mesa contact structures extending from the mean surface plane into the plurality of transistor mesas and directly adjoining source zones and the body zones.

13. The semiconductor device of claim 12, wherein a vertical extension of the mesa contact structures in the semiconductor body is equal to or greater than a vertical extension of the plurality of trench gate structures.

14. The semiconductor device of claim 1, further comprising diode mesas comprising at least portions of diode regions that form third pn junctions with a drift structure and that directly adjoin two neighboring trench gate structures of the plurality of trench gate structures, respectively, wherein transistor and diode mesas alternate at least along a first horizontal direction parallel to a longitudinal axis of the plurality of trench gate structures.

15. The semiconductor device of claim 14, wherein a distance between the first surface and the third pn junctions is greater than a vertical extension of the plurality of trench gate structures perpendicular to the first surface.

16. The semiconductor device of claim 14, wherein the diode regions include shielding portions in a vertical projection of the plurality of trench gate structures.

17. The semiconductor device of claim 16, wherein the shielding portions do not overlap with the plurality of transistor mesas.

18. The semiconductor device of claim 14, wherein the transistor and diode mesas further alternate, separated by trench gate structures of the plurality of trench gate structures, along a second horizontal direction orthogonal to the first horizontal direction.

19. The semiconductor device of claim 1, wherein a drift structure comprises a lightly doped drift zone and current spread zones between the drift zone and the body zones, and a mean net dopant concentration in the current spread zones is at least twice as high as a mean net dopant concentration in the drift zone.

20. The semiconductor device of claim 1, wherein the sidewalls of the plurality of transistor mesas are aligned with the <1-100> crystal direction.

21. The semiconductor device of claim 1, wherein the first surface is planar.

22. The semiconductor device of claim 1, wherein the trench sidewalls of the plurality of trench gate structures are substantially perpendicular to the first surface.

23. A semiconductor device comprising:
a semiconductor body with a hexagonal crystal lattice, wherein a mean surface plane of a first surface of the semiconductor body is tilted with respect to a <1-100> crystal direction of the hexagonal lattice by an off-axis angle; and
a plurality of trench gate structures extending into the semiconductor body, wherein trench sidewalls of the plurality of trench gate structures are aligned with a (11-20) crystal plane; and
a plurality of transistor mesas formed in the semiconductor body between neighboring trench gate structures of the plurality of trench gate structures, wherein sidewalls of the plurality of transistor mesas deviate from a normal to the mean surface plane by at most 5 degrees, and
wherein each trench gate structure is adjoined by two MOS gate channels.

24. A semiconductor device comprising:
a semiconductor body with a hexagonal crystal lattice, wherein a mean surface plane of a first surface of the semiconductor body is tilted with respect to a <1-100> crystal direction of the hexagonal crystal lattice by an off-axis angle;
a trench gate structure extending into the semiconductor body; and
at least two transistor mesas formed from portions of the semiconductor body and adjoining the trench gate structure,
wherein sidewalls of the at least two transistor mesas are aligned with a (11-20) crystal plane and deviate from a normal to the mean surface plane by at most 5 degrees, and
wherein each transistor mesa comprises a MOS gate channel.

25. A semiconductor device comprising:
a semiconductor body with a hexagonal crystal lattice, wherein a mean surface plane of a first surface of the semiconductor body is tilted to a <1-100> crystal direction of the hexagonal crystal lattice by an off-axis angle, wherein an absolute value of the off-axis angle is in a range from 2 degree to 12 degree;
a trench gate structure extending into the semiconductor body, wherein a trench sidewall of the trench gate structure is aligned with a (11-20) crystal plane of the hexagonal crystal lattice; and
a transistor mesa formed in the semiconductor body, wherein the transistor mesa adjoins the sidewall of the trench gate structure,
wherein the sidewall of the transistor mesa deviates from a normal to the mean surface plane by at most 5 degree.

* * * * *